United States Patent
Vecera et al.

(10) Patent No.: US 6,954,112 B2
(45) Date of Patent: Oct. 11, 2005

(54) METHOD OF FORMING A VARIABLE FREQUENCY OSCILLATOR AND STRUCTURE THEREFOR

(75) Inventors: Ivo Vecera, Ostrava (CZ); Petr Kadanka, Valasska Bystrice (CZ)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 108 days.

(21) Appl. No.: 10/642,539

(22) Filed: Aug. 18, 2003

(65) Prior Publication Data

US 2005/0040897 A1 Feb. 24, 2005

(51) Int. Cl.[7] .............................. H03B 5/20; H03B 5/24

(52) U.S. Cl. ...................... 331/143; 331/111; 331/175; 331/177 R; 331/186

(58) Field of Search ............................. 331/111, 143, 331/175, 177 R, 185, 186; 327/131–140

(56) References Cited

U.S. PATENT DOCUMENTS 6,404,295 B1 * 6/2002 Minami et al. ............... 331/57

* cited by examiner

*Primary Examiner*—David Mis
(74) *Attorney, Agent, or Firm*—Robert F. Hightower

(57) ABSTRACT

A variable-frequency oscillator (10) is formed to change an internal delay of the oscillator inversely proportional to changes in the frequency of the oscillator.

19 Claims, 3 Drawing Sheets

METHOD OF FORMING A VARIABLE FREQUENCY OSCILLATOR AND STRUCTURE THEREFOR

BACKGROUND OF THE INVENTION

The present invention relates, in general, to electronics, and more particularly, to methods of forming semiconductor devices and structure.

In the past, the semiconductor industry utilized various methods and structures to produce variable frequency oscillators. One particular oscillator implementation, referred to as a saw-tooth oscillator, was used in various applications. Saw-tooth oscillators generally charged a capacitor with current sources and used the voltage across the capacitor as the output signal or oscillating signal. One problem with the variable frequency saw-tooth oscillator implementations was the linearity of changes in the frequency of the oscillating signal resulting from changes in a frequency control signal. This relationship is referred to hereinafter as control linearity. The saw-tooth oscillator typically had internal delays that affected the period of the oscillating frequency. At low frequencies, the delay within the oscillator was a small part of the oscillation period. At high frequencies the delay became a more significant portion of the period and resulted in poor control linearity.

Accordingly, it is desirable to have an oscillator that has a more constant control linearity over the oscillator frequency range.

For simplicity and clarity of illustration, elements in the figures are not necessarily to scale, and the same reference numbers in different figures denote the same elements. Additionally, descriptions and details of well known steps and elements are omitted for simplicity of the description. As used herein current carrying electrode means an element of a device that carries current through the device such as a source or a drain of an MOS transistor or an emitter or a collector of a bipolar transistor, and a control electrode means an element of the device that controls current through the device such as a gate of an MOS transistor or a base of a bipolar transistor. Although the devices are explained herein as certain P-Channel and N-channel devices, a person of ordinary skill in the art will appreciate that complementary devices are also possible in accordance with the present invention.

DETAILED DESCRIPTION OF THE DRAWINGS

Figure 1:
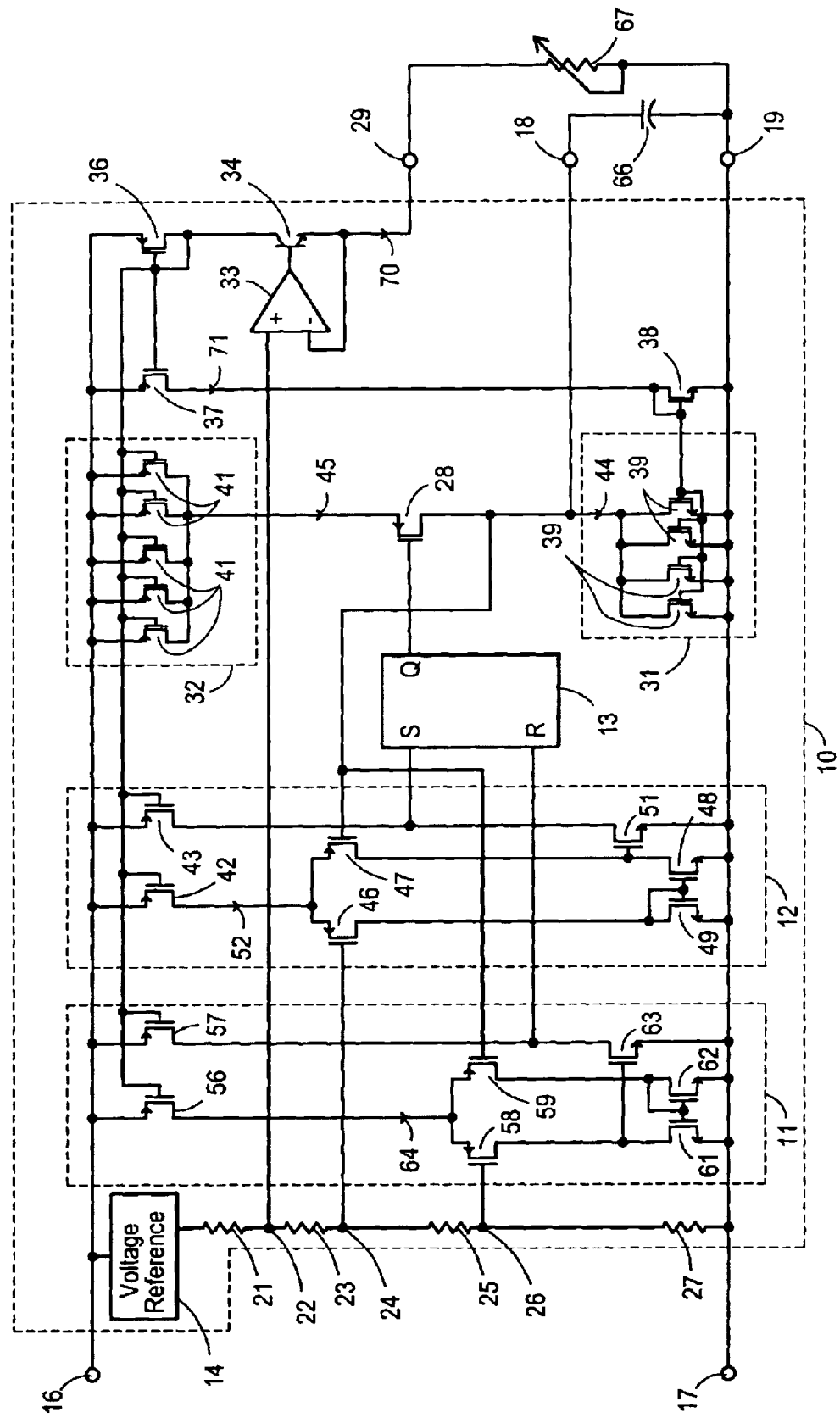
FIG. 1 schematically illustrates an embodiment of a portion of an oscillator in accordance with the present invention.

FIG. 1 schematically illustrates a portion of an embodiment of a variable frequency oscillator 10 that changes internal delays through oscillator 10 inversely proportional to changes in the frequency of oscillator 10. Oscillator 10 forms an output signal or oscillating signal on an oscillator output 18. Oscillator 10 forms the oscillating signal by alternately charging and discharging a capacitor 66 that is connected between output 18 and a signal return 19. The frequency of the oscillating signal is adjusted by a control signal that is applied to a control input 29. Oscillator 10 receives power that is applied between a voltage input 16 and a voltage return 17. Typically, return 17 is connected to return 19. Oscillator 10 includes a discharge current source 31, a charging current source 32, an upper threshold comparator 12, a lower threshold comparator 11, a voltage reference 14, a switch or switch transistor 28, and a storage element or latch 13. Dashed boxes are used to highlight comparators 11 and 12 in addition to sources 31 and 32.

Discharge current source 31 is used to discharge capacitor 66 at a rate that is controlled by a discharge current 44 that flows through source 31. When transistor 28 is enabled, charging current source 32 supplies a current 45 that facilitates charging of capacitor 66. Currents 44 and 45 are illustrated by arrows. Current 45 is larger than current 44, thus, when transistor 28 is enabled a portion of current 45 flows through source 31 and an excess portion of current 45 flows through capacitor 66 as a charging current in order to charge capacitor 66. Thus, the charging current is the difference between currents 44 and 45. Latch 13 and comparators 11 and 12 are utilized to control enabling and disabling transistor 28 and generate the oscillating signal on output 18. Comparators 11 and 12 compare the voltage of the oscillating signal to reference voltages provided by reference 14 and resistors 21, 23, 25, and 27. A control reference voltage is formed at a node 22, an upper threshold voltage is formed at a node 24, and a lower threshold voltage is formed at a node 26. When current source 32 has charged capacitor 66 to a value that is equal to or greater than the upper threshold voltage, the output of comparator 12 goes high setting latch 13 and disabling transistor 28. This enables source 31 to discharge capacitor 66 at a rate control by current 44. When current source 31 discharges capacitor 66 to a value that is equal to or less than the lower threshold voltage, the output of comparator 11 goes high and resets latch 13. This enables transistor 28 thereby once again enabling source 32 to begin charging capacitor 66. The charging and discharging of capacitor 66 continues at the charging and discharging rates established by currents 45 and 44 thereby forming the oscillating signal on output 18. Comparators 11 and 12 along with latch 13 and transistor 28 form a feedback path from output 18 that affects the operation of oscillator 10 as will be seen hereinafter. It should be noted that a voltage divider could be used to adjust the relationship between the voltage of the oscillating signal on output 18 and the threshold voltages to a ratio that is different from the direct 1:1 ratio used by oscillator 10.

The frequency of the oscillating signal is changed by changing the value of current 45 and current 44. An amplifier 33, a transistor 34, and a reference transistor 36 form a bias generator that along with a variable resistor 67 are utilized to establish a control current 70, illustrated by an arrow, that is used to control the value of currents 44 and 45. Thus current 70 forms a frequency control signal that determines the oscillation frequency of oscillator 10. Additionally, current 70 is also utilized to change the delay through oscillator 10 as will be seen further hereinafter. In some embodiments, the frequency of oscillator 10 may be fixed and resistor 67 would be replaced by a fixed value resistor. Amplifier 33 and transistor 34 form a voltage-to-current converter that assists in forming current 70. Amplifier 33 receives the control reference voltage from node 22 and drives the base of transistor 34. Amplifier 33 and transistor 34 form a voltage on the emitter of transistor 34 and on input 29 that is approximately equal to the control reference voltage. This voltage is dropped across resistor 67, thus, the value of resistor 67 sets the value of current 70. Varying the value of resistor 67 then varies the value of the frequency control signal and the value of current 70. As will be seen hereinafter, the value of current 70 is used to establish the frequency and the delay within oscillator 10. Those skilled in the art will realize that resistor 67, amplifier 33, and transistor 34 could be replaced by a current generator circuit that generates current 70.

Reference transistor 36 is connected to receive current 70 and to mirror current 70 through a current mirror connection with a current mirror transistor 37. Because of the current mirror configuration, a current 71, illustrated by an arrow, that is approximately equal to reference current 70 is established through transistor 37. Current 71 flows through a reference transistor 38 that is connected in a current mirror configuration with a plurality of current mirror transistors 39 that form current source 31. Because of the current mirror configuration, a current approximately equal to current 71 is established through each of the plurality of current mirror transistors 39. The sum of these currents forms current 44. Transistor 36 is also connected in a current mirror configuration with a plurality of transistors 41 that form current source 32. Because of the current mirror configuration, a current approximately equal to current 70 flows through each of the plurality of transistors 41. These currents sum to form current 45. It is necessary to ensure that current 45 is larger than current 44. The size and conductivity of transistors 36, 37, 38, 39, and 41 and ratios of the current mirrors are formed to ensure that oscillator 10 operates over the desired frequency range and to provide good matching and tracking between currents 70, 71, 44, and 45. Current 45 could be formed larger than current 44 by various other means including changing the ratio of the transistors in the current mirror configurations. Varying the value of resistor 67 varies the value of current 70 and consequently the value of currents 44 and 45. Increasing the value of currents 44 and 45 charges and discharges capacitor 66 in a shorter period of time thereby increasing the frequency of oscillator 10. Conversely decreasing the value of current 70 lowers the frequency of oscillator 10.

Oscillator 10 is also formed to change the delay through the feedback path elements of comparator 11 and comparator 12 inversely proportional to the change in frequency of oscillator 10. In the preferred embodiment, this is accomplished by changing the bias currents used to bias the differential stages of comparators 11 and 12. Oscillator 10 is formed to change the bias currents proportional to the change in frequency. For example, increasing the frequency increases the bias currents which decreases the delay. Comparator 11 includes a pair of differential transistors 58 and 59 that are coupled to receive a bias current 64, illustrated by an arrow, from a bias transistor 56. Transistors 58 and 59 are also coupled to an active load current mirror of transistors 61 and 62, respectively. Transistors 61 and 62 receive current from transistors 58 and 59 and drive the gate of an output transistor 63. Transistor 63 receives a bias current from transistor 57. When the value of the voltage applied to the gate of transistor 59 is lower than the voltage applied to the gate of transistor 58, transistor 63 is disabled and transistor 57 pulls the output of comparator 11 high. Similarly, comparator 12 has a pair of differential transistors 46 and 47 that received a bias current 52 from a bias transistor 42. Transistors 46 and 47 are coupled to an active load current mirror of transistors 48 and 49 that functions similarly to transistors 61 and 62. An output transistor 51 is coupled to receive the voltage created by the current through transistor 47. Transistor 51 receives a bias current from a bias transistor 43 that functions similarly to transistor 57. When the value of the voltage on the gate of transistor 47 is greater than the value of the voltage on the gate of transistor 46, transistor 51 is disabled and transistor 43 pulls the output of comparator 12 high. Bias transistors 42, 43, 56, and 57, are coupled in a current mirror configuration with transistor 36. The size of transistors 42, 43, 56, 57, and 36 are all selected to ensure that the value of the bias currents supplied by transistors 42, 43, 56, and 57 vary directly with changes in reference current 70 and thus directly with changes in currents 44 and 45. Consequently, as the value of currents 44 and 45 are increased or decreased to respectively increase or decrease the oscillating frequency, the value of the bias currents supplied by transistors 42, 43, 56, and 57 is also respectively increased or decreased in the same percentage thereby decreasing or increasing, respectively, the delay through comparators 11 and 12. Since the delay through comparators 11 and 12 represents the majority of the delay in the feedback path, reducing the delay in comparators 11 and 12 improves the control linearity of oscillator 10.

Figure 2:
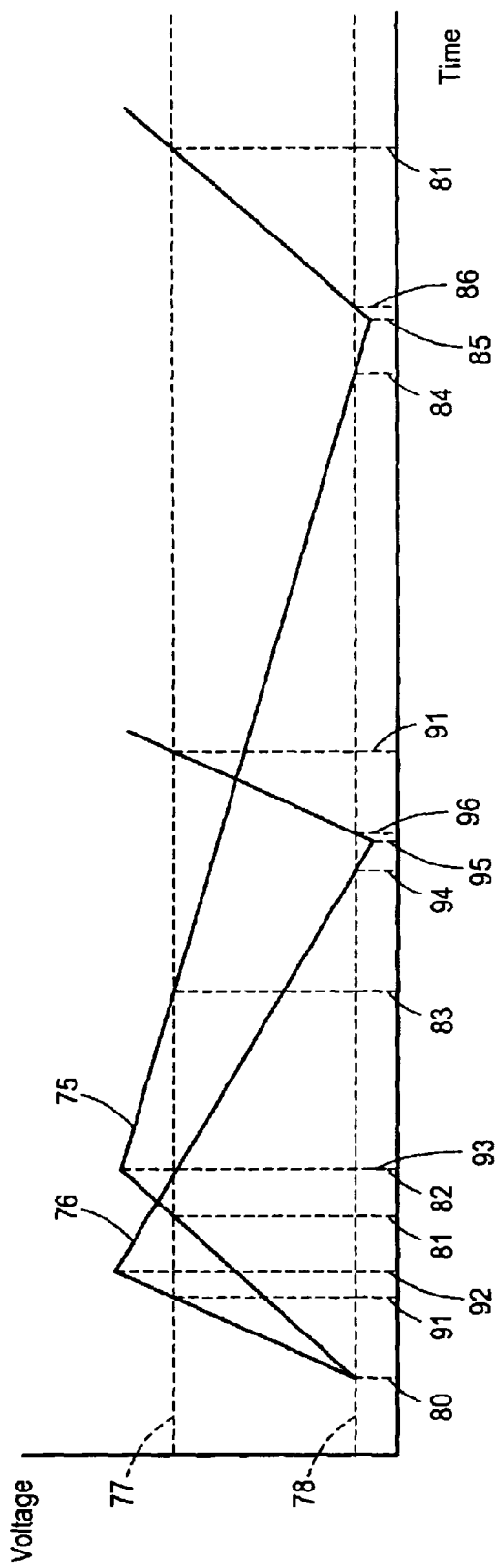
FIG. 2 is a graph having plots of the operation of the oscillator of FIG. 1 in accordance with the present invention.

FIG. 2 is a graph having a plot 75 that illustrates a portion of a cycle of the oscillating signal oscillating at a first frequency, and a plot 76 that illustrates a portion of a cycle of the oscillating signal oscillating at a second frequency that is greater than the first frequency. The abscissa represents time and the ordinate indicates voltage. A voltage 78 represents the lower threshold voltage at node 26 and a voltage 77 represents the upper threshold voltage at node 24. For clarity of the description, this explanation will have references to both FIG. 1 and FIG. 2. Comparators 11 and 12 along with latch 13 and transistor 28 form the feedback path from output 18 that affect the operation of oscillator 10. The value of this delay has an impact on the period of the oscillating signal formed by oscillator 10. Referring to plot 75, at a time 80 the charging current begins charging capacitor 66. The charging current continues charging capacitor 66 until the voltage on output 18 reaches voltage 77 at a time 81. Because of the delay in the feedback path, transistor 28 is not disabled until later at a time 82 when the charging current has charged capacitor 66 to a voltage greater than voltage 77. Current 44 begins discharging capacitor 66 from the higher voltage down to voltage 77 at a time 83 and continues discharging capacitor 66 until the oscillating signal reaches voltage 78 at a time 84. Because of the delay in the feedback path, transistor 28 is not enabled until a time 85 and capacitor 66 is discharged to a voltage that is less than voltage 78. The charging current begins charging capacitor 66 from the lower voltage up to voltage 78 at a time 86 and continues charging capacitor 66 to voltage 77 at a time 81. The delay in the feedback path of oscillator 10 shown between times 81 and 82 and between times 84 and 85 extends the period of the oscillating signal. Also, the additional recovery time between times 82 and 83 and between times 85 and 86 add to the period.

When the frequency of oscillator 10 is changed, oscillator 10 also changes the delay inversely proportional to the frequency change and keeps the delay time substantially the same percent of the oscillation period in order to increase the control linearity of oscillator 10. Changing the delay time also changes the recovery time so that they remain the same percent of the oscillation period in order to increase the control linearity of oscillator 10. Changing the delay and recovery time also keeps the control linearity more constant over the operating frequency range of oscillator 10. This is illustrated by plot 76. Current 70 and correspondingly currents 44 and 45 are increased to increase the frequency of the oscillating signal. Current 70 also increases bias currents 52 and 64 to reduce the delay in the feedback path of oscillator 10. Currents 52 and 64 are increased by the same percent that currents 44 and 45 are increased. For example, if currents 44 and 45 are doubled, currents 52 and 64 are also doubled thereby reducing the delay and the recovery times by one-half (½). At time 80, the charging current begins charging capacitor 66 until the oscillating signal reaches voltage 77 at a time 91. Because of the delay in the feedback path, transistor 28 is not disabled until later at a time 92 when the voltage on capacitor 66 has been charged to a value greater than voltage 77. The delay from time 91 to time 92 adds to the period of the oscillating signal. However, the amount of time between times 91 and 92 is less than the amount of time between times 81 and 82. Current 44 discharges capacitor 66 to voltage 77 at a time 93 and continues the discharging until a time 95. Note that because of the scale illustrated in FIG. 2, time 93 is shown to coincidentally coincide with time 82. Once again, because of the delay in the feedback path, transistor 28 is not enabled when the oscillating signal reaches voltage 78 at a time 94. The charging current once again charges capacitor 66 to voltage 78 at a time 96 and continues charging until after reaching voltage 77 at a time 91. As before in plot 75, the period of the oscillating signal is extended by the delay time between times 91 and 92 and between times 94 and 95 in addition to the additional recovery time between times 92 and 93, and 95 and 96. It can be shown that the delay time and the recovery time are all changed by the inverse in the change in the frequency. For example, if the frequency is doubled, both the delay time and the recovery time are approximately halved.

In one example of oscillator 10, resistor 67 was variable from about twenty two thousand to three hundred thirty thousand Ohms (22 k–330 k Ohms), and the resulting oscillating signal varied over a range of about twenty kilo-Hertz (20 kHz) to three hundred and thirty kilo-Hertz (330 kHz). Over this range, the control linearity had a variation less than about 1.5 percent (1.5%).

If the frequency were increased without changing the delay time and the recovery time, the delay and recovery time would be constant for all frequencies, thus, the control linearity would be decreased and would vary greatly over the operating frequency range. In the example above if the frequency were increased without changing the delay time and the recovery time, the control linearity would have varied more than fifteen percent (15%).

In order to facilitate this operation, a first terminal of resistor 21 is connected to the output of reference 14. A second terminal of resistor 21 is connected to node 22 and to a first terminal of resistor 23. A second terminal of resistor 23 is connected to node 24 and to a first terminal of resistor 25. A second terminal of resistor 25 is connected to node 26 and to a first terminal of resistor 27 which has a second terminal connected to return 17. A first current carrying electrode of transistor 56 is connected to input 16. A second current carrying electrode of transistor 56 is connected to a first current carrying electrode of transistors 58 and 59. Transistor 58 has a control electrode connected to node 26 and a second current carrying electrode connected to a first current carrying electrode of transistor 61, and to a control electrode of transistor 63. A second current carrying electrode of transistor 61 is connected to return 17. A second current carrying electrode of transistor 59 is connected to a first current carrying electrode of transistor 62, and to a control electrode of transistors 61 and 62. Transistor 62 has a second current carrying electrode connected to return 17. Transistor 63 has a first current carrying electrode connected to return 17 and a second current carrying electrode connected to the output of comparator 11, to a reset input of latch 13, and to a first current carrying electrode of transistor 57. Transistor 57 has a second current carrying electrode connected to input 16. Transistor 42 has a first current carrying electrode connected to input 16 and a second current carrying electrode connected to a first current carrying electrode of transistors 46 and 47. Transistor 46 has a control electrode connected to node 24 and a second current carrying electrode connected to a control electrode of transistors 49 and 48 and to a first current carrying electrode of transistor 49. Transistor 49 has a second current carrying electrode connected to return 17. Transistor 48 has a first current carrying electrode connected to return 17 and a second current carrying electrode connected to a control electrode of transistor 51 and to a second current carrying electrode of transistor 47. Transistor 51 has a first current carrying electrode connected to return 17 and a second current carrying electrode connected to the output of comparator 12, a set input of latch 13, and a first current carrying electrode of transistor 43. Transistor 43 has a second current carrying electrode connected to input 16. Transistor 28 has a control electrode connected to a Q output of latch 13, a first current carrying electrode connected to a first current carrying electrode of each of plurality of transistors 41, and a second current carrying electrode connected to output 18, to a control electrode of transistor 47, and to a first current carrying electrode of each of plurality of transistors 39. Plurality of transistors 41 each have a second current carrying electrode connected to input 16. Plurality of transistors 39 each have a second current carrying electrode connected to return 17, and a control electrode connected to a control electrode of transistor 38, a first current carrying electrode of transistor 38, and a first current carrying electrode of transistor 37. A second current carrying electrode of transistor 38 is connected to return 17 and a second current carrying electrode of transistor 37 is connected to input 16. Amplifier 33 has a positive input connected to node 22, and a negative input connected to input 29 and to a first current carrying electrode of transistor 34. A control electrode of transistor 34 is connected to the output of amplifier 33, and a second current carrying electrode of transistor 34 is connected to a first current carrying electrode of transistor 36, to a control electrode of transistors 36 and 37, to a control electrode each of plurality of transistors 41, and to the control electrode of transistors 42, 43, 56, and 57. Transistors 36 and 37 each have a second current carrying electrode connected to input 16. Typically output 18 is connected to a first terminal of capacitor 66 and a second terminal of capacitor 66 is connected to return 19. Input 29 typically is connected to a first terminal of resistor 67 and a second terminal of resistor 67 is connected to return 19.

Figure 3:
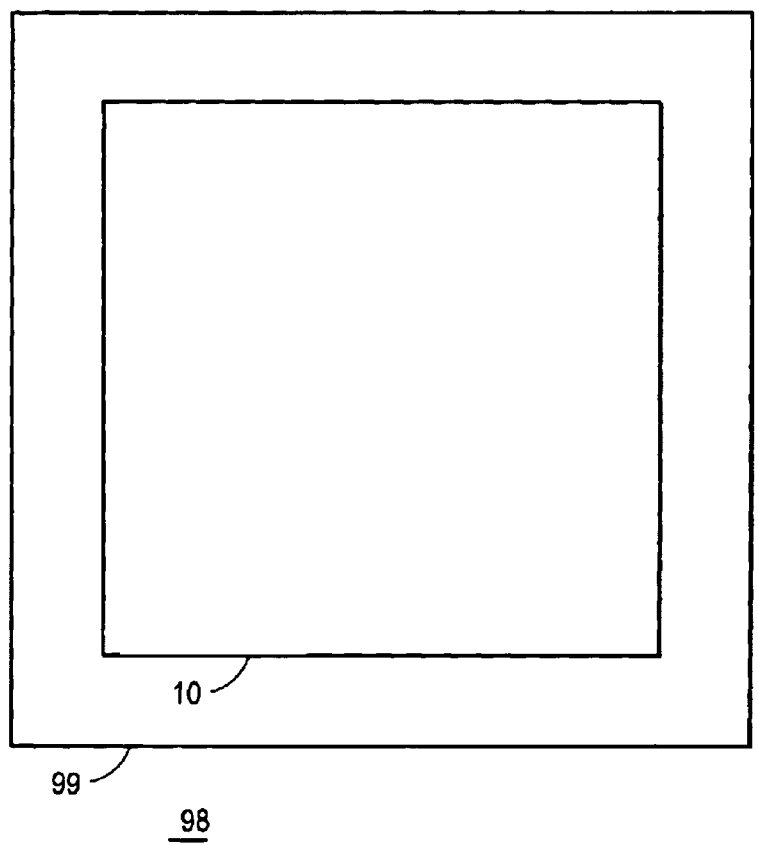
FIG. 3 schematically illustrates an enlarged plan view of a semiconductor device that includes the oscillator of FIG. 1 in accordance with the present invention.

FIG. 3 schematically illustrates an enlarged plan view of a portion of an embodiment of a semiconductor device 98 that is formed on a semiconductor die 99. Oscillator 10 is formed on die 99. Die 99 may also include other circuits that are not shown in FIG. 3 for simplicity of the drawing.

In view of all of the above, it is evident that a novel device and method is disclosed. Included, among other features, is changing an internal delay of an oscillator when the oscillator frequency is changed. Changing the delay inversely proportional to the frequency change results in more linear operation over the oscillator's operating frequency range.

While the invention is described with specific preferred embodiments, it is evident that many alternatives and variations will be apparent to those skilled in the semiconductor

What is claim is:

1. A method of forming an oscillator comprising:
   forming a saw-tooth oscillator having a delay including forming the saw-tooth oscillator to generate a frequency; and
   forming the saw-tooth oscillator to generate the delay so that changing the frequency generates an inversely proportional change in the delay.

2. The method of claim 1 wherein forming the saw-tooth oscillator to generate the delay so that changing the frequency generates the inversely proportional change in the delay includes forming the saw-tooth oscillator to generate the inversely proportional change in the delay within elements of a feedback path of the saw-tooth oscillator.

3. The method of claim 2 wherein forming the saw-tooth oscillator to generate the inversely proportional change in the delay within elements of the feedback path of the saw-tooth oscillator includes forming the saw-tooth oscillator to generate a bias current of the elements of the feedback path.

4. The method of claim 3 wherein forming the saw-tooth oscillator to generate the bias current of the elements of the feedback path includes generating the bias current so that changing the frequency generates a proportional change in the bias current.

5. The method of claim 1 wherein forming the saw-tooth oscillator to generate the delay so that changing the frequency generates the inversely proportional change in the delay includes forming a multiple saw-tooth oscillator to generate the delay.

6. The method of claim 1 wherein forming the saw-tooth oscillator having the delay includes coupling a comparator in a feedback path of the saw-tooth oscillator.

7. The method of claim 6 wherein coupling the comparator in the feedback path of the saw-tooth oscillator includes forming the saw-tooth oscillator to generate the delay within the comparator.

8. The method of claim 6 wherein coupling the comparator in the feedback path of the saw-tooth oscillator includes forming a bias generator of the comparator to generate a bias current of the comparator so that changing the frequency generates a proportional change in the bias current.

9. The method of claim 1 wherein forming the saw-tooth oscillator to generate the delay so that changing the frequency generates the inversely proportional change in the delay includes forming the saw-tooth oscillator to generate the delay so that changing a value of a resistor changes the frequency.

10. A method of operating an oscillator comprising:
    generating an oscillating signal having a frequency at an output of an oscillator; and
    generating a delay of the oscillator so that changes in the frequency generate an inversely proportional change in the delay including generating a delay of a comparator that is in a feedback path of the oscillator.

11. The method of claim 10 wherein generating the delay of the oscillator so that changes in the frequency generate the inversely proportional change in the delay includes generating a bias current of elements in the feedback path of the oscillator including generating the bias current proportional to a bias current used to establish the frequency.

12. The method of claim 10 wherein generating the delay of the oscillator so that changes in the frequency generate the inversely proportional change in the delay includes changing a bias current of elements in the feedback path of the oscillator including changing the bias current proportionally to changes in the frequency.

13. The method of claim 10 wherein generating the oscillating signal having the frequency at the output of the oscillator includes using a saw-tooth oscillator to generate the oscillating signal.

14. The method of claim 10 wherein generating the delay of the comparator includes biasing the comparator with a bias current that is used to establish the frequency.

15. The method of claim 14 wherein biasing the comparator with the bias current that is used to establish the frequency includes changing the bias current to change the frequency and the delay.

16. The method of claim 10 further including controlling a state of a latch with an output of the comparator.

17. An oscillator comprising:
    an output for generating an on oscillating signal;
    a feedback path for receiving the oscillating signal, the feedback path having an active element that has a delay including the feedback path having a comparator coupled to receive the oscillating signal; and
    a bias generator coupled to provide a bias current to the active element, and coupled to receive a frequency control signal and responsively generate the bias current.

18. The oscillator of claim 17 wherein the bias generator coupled to provide the bias current includes the bias generator coupled to generate the bias current responsively to a value of a resistor.

19. The oscillator of claim 17 wherein the bias generator coupled to provide the bias current includes the bias generator coupled to provide a current of a current source of the comparator.